United States Patent
Ukai et al.

(10) Patent No.: US 7,915,729 B2
(45) Date of Patent: Mar. 29, 2011

(54) LOAD DRIVING SEMICONDUCTOR APPARATUS

(75) Inventors: Yoshimitsu Ukai, Gifu (JP); Kazunori Ozawa, Chiryu (JP); Fukuo Ishikawa, Kariya (JP)

(73) Assignee: Anden Co., Ltd., Anjo (JP)

( * ) Notice: Subject to any disclaimer, the term of this patent is extended or adjusted under 35 U.S.C. 154(b) by 173 days.

(21) Appl. No.: 12/385,902

(22) Filed: Apr. 23, 2009

(65) Prior Publication Data

US 2009/0279266 A1 Nov. 12, 2009

(30) Foreign Application Priority Data

May 6, 2008 (JP) .................. 2008-120822

(51) Int. Cl.
*H01L 23/34* (2006.01)
*H01L 23/10* (2006.01)
*H01L 23/28* (2006.01)

(52) U.S. Cl. ........ 257/712; 257/706; 257/707; 257/717; 257/720; 257/796; 257/E23.051

(58) Field of Classification Search .................. 257/712, 257/717, 720, 796, E23.051, 706, 707
See application file for complete search history.

(56) References Cited

U.S. PATENT DOCUMENTS

| | | | | |
|---|---|---|---|---|
| 5,345,107 A * | 9/1994 | Daikoku et al. | ............... | 257/717 |
| 5,467,251 A * | 11/1995 | Katchmar | ..................... | 361/719 |
| 5,982,038 A * | 11/1999 | Toy et al. | ...................... | 257/772 |
| 6,545,873 B1 * | 4/2003 | Han et al. | ...................... | 361/728 |
| 6,809,417 B1 * | 10/2004 | Rossetti | ........................ | 257/707 |
| 7,252,408 B2 * | 8/2007 | Mazzochette et al. | ......... | 362/294 |
| 7,538,426 B2 * | 5/2009 | Yamabuchi et al. | .......... | 257/714 |
| 7,616,444 B2 * | 11/2009 | Munch et al. | .................... | 361/719 |
| 7,646,093 B2 * | 1/2010 | Braunisch et al. | ............ | 257/718 |
| 7,656,028 B2 * | 2/2010 | Wilkins et al. | ................ | 257/714 |
| 2005/0197799 A1 | 9/2005 | Kamezawa et al. | ........... | 702/130 |
| 2005/0258533 A1 * | 11/2005 | Kumano et al. | ............... | 257/712 |
| 2006/0049513 A1 * | 3/2006 | Goodwin | ...................... | 257/712 |

FOREIGN PATENT DOCUMENTS

JP 2001102518 A * 4/2001

* cited by examiner

*Primary Examiner* — Ida M Soward
(74) *Attorney, Agent, or Firm* — Posz Law Group, PLC

(57) ABSTRACT

A load driving semiconductor apparatus includes: a driving transistor, which operates based on an input voltage from an external circuit; a power semiconductor device controlling power supply to a load in such a manner that the power semiconductor device supplies electric power to the load when the transistor operates, and the power semiconductor device stops supplying electric power to the load when the transistor stops operating; and a mounting board, on which the driving transistor and the power semiconductor device are mounted. The mounting board includes a heat radiation pattern for emitting heat generated in the power semiconductor device. The heat radiation pattern includes a heat receiving pattern, on which the driving transistor is mounted.

9 Claims, 3 Drawing Sheets

LOAD DRIVING SEMICONDUCTOR APPARATUS

CROSS REFERENCE TO RELATED APPLICATION

This application is based on Japanese Patent Application No. 2008-120822 filed on May 6, 2008, the disclosure of which is incorporated herein by reference.

FIELD OF THE INVENTION

The present invention relates to a load driving semiconductor apparatus.

BACKGROUND OF THE INVENTION

JP-A-2005-252090 corresponding to US Patent Application Publication No. 2005/0197799 discloses an element or a circuit for detecting temperature of a power semiconductor device in order to protect the power semiconductor device from heat. Specifically, the element or the circuit stops operating the power semiconductor device. For example, to protect the device from heat, a temperature detector is arranged neatthe device. Specifically, the temperature detector is disposed near an emitter terminal or a collector terminal of the device. When the detected temperature exceeds a predetermined temperature, the element stops energizing the power semiconductor device so that heat generated in the power semiconductor device is reduced.

However, the above technique for detecting the temperature of the device may be effective for a case where the power semiconductor device generates excess heat caused by excess load. The above technique does not work for a case where the excess heat is caused by deficiency of driving performance of the power semiconductor device because of a low supply voltage or the like. To restrict the excess heat caused by the deficiency of driving performance, the performance of a driving circuit for driving the power semiconductor device is increased so that the deficiency of driving performance is resolved. In this case, the structure of the driving circuit becomes complex. Therefore, the manufacturing cost of the driving circuit increases.

Even when the power semiconductor device includes a temperature detecting function, it is preferable to restrict the excess heat of the power semiconductor device since the temperature detecting function may be malfunction so that the temperature is not detected accurately.

SUMMARY OF THE INVENTION

In view of the above-described problem, it is an object of the present disclosure to provide a load driving semiconductor apparatus. The apparatus improves driving performance of a power semiconductor device, and restricts excess heat generated in the power semiconductor device.

According to an aspect of the present disclosure, a load driving semiconductor apparatus includes: a driving transistor, which operates based on an input voltage from an external circuit; a power semiconductor device controlling power supply to a load in such a manner that the power semiconductor device supplies electric power to the load when the transistor operates, and the power semiconductor device stops supplying electric power to the load when the transistor stops operating; and a mounting board, on which the driving transistor and the power semiconductor device are mounted. The mounting board includes a heat radiation pattern for emitting heat generated in the power semiconductor device. The heat radiation pattern includes a heat receiving pattern, on which the driving transistor is mounted.

In the above apparatus, the heat generated in the power semiconductor device is effectively transmitted to the driving transistor, so that the driving performance of the driving transistor is improved. Accordingly, the device is not operated in a half on-state. Thus, the performance of the device is improved without adding another driving circuit, so that excess heat in the device is reduced.

Alternatively, the driving transistor, the power semiconductor device and the heat radiation pattern may be arranged on one side of the mounting board. Further, the heat radiation pattern may have a square shape with a notch. The notch is disposed on one side of the square shape. The driving transistor is arranged in the notch. The heat receiving pattern protrudes from a sidewall of the notch toward the driving transistor. The power semiconductor device is arranged on the other side of the square shape, which is opposite to the one side. Furthermore, the heat receiving pattern may have a width along with a direction perpendicular to a heat transmission path from the power semiconductor device to the driving transistor. The heat radiation pattern other than the heat receiving pattern has a width along with a direction perpendicular to the heat transmission path from the power semiconductor device to the driving transistor, and the width of the heat receiving pattern is smaller than the width of the heat radiation pattern.

Alternatively, the power semiconductor device and the heat radiation pattern other than the heat receiving pattern may be arranged on one side of the mounting board. The driving transistor is arranged on the other side of the mounting board. The mounting board further includes a through hole, which penetrates from the one side to the other side of the board, and the heat receiving pattern is disposed on the through hole, and exposed from the other side so that the driving transistor contacts the heat receiving pattern. Further, the heat receiving pattern may have a width along with a direction perpendicular to a heat transmission path from the power semiconductor device to the driving transistor. The heat radiation pattern other than the heat receiving pattern has a width along with a direction perpendicular to the heat transmission path from the power semiconductor device to the driving transistor, and the width of the heat receiving pattern is smaller than the width of the heat radiation pattern.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
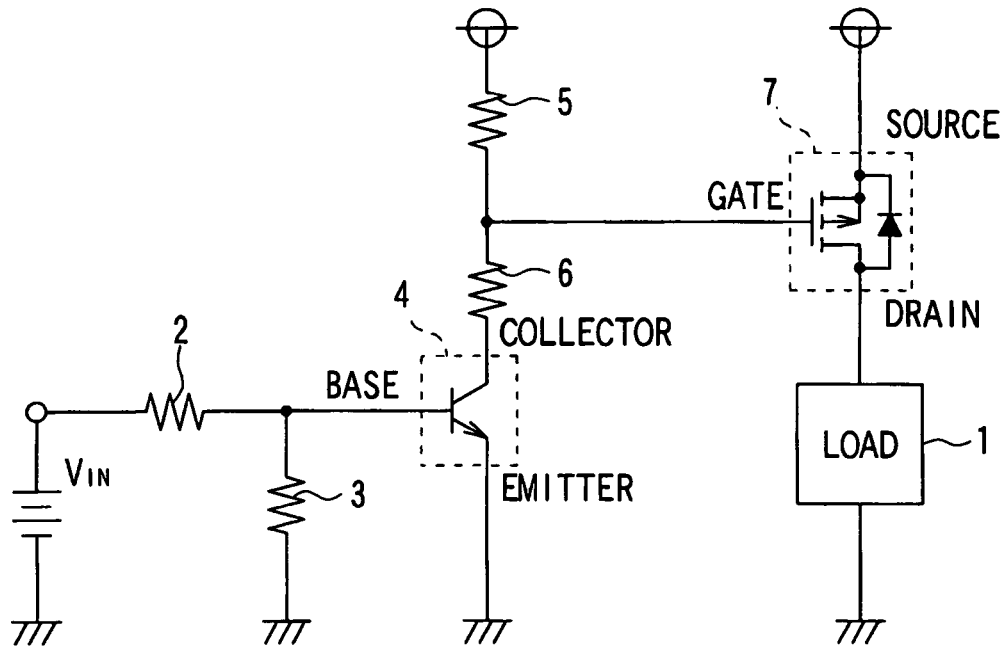
FIG. 1 is a circuit diagram showing a semiconductor apparatus for driving a load according to a first embodiment.
Figure 2:
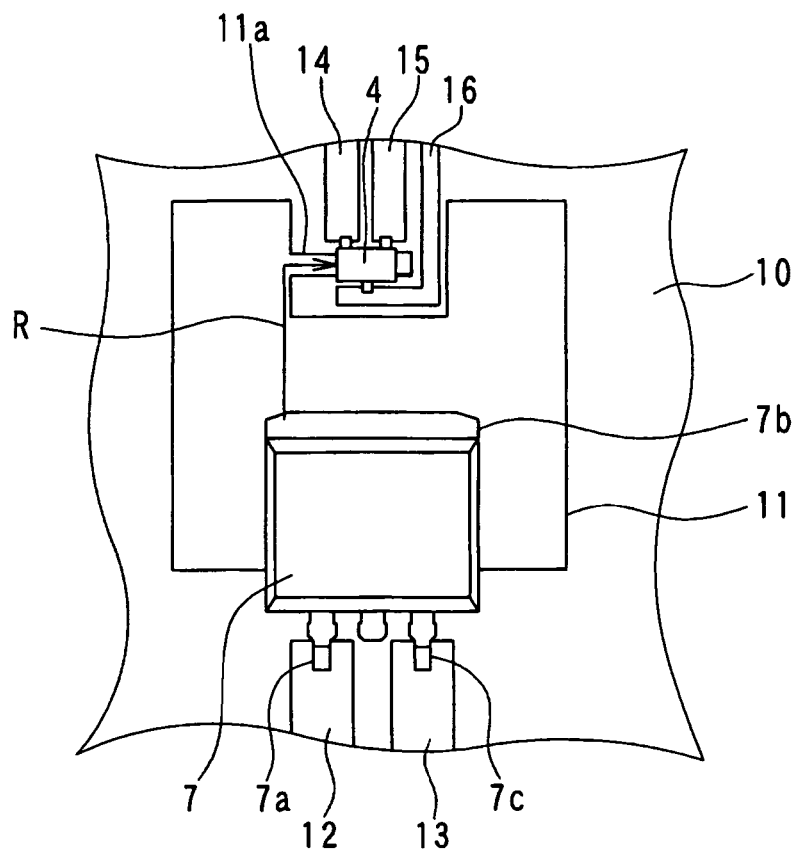
FIG. 2 is a diagram showing a top view of the apparatus.

FIGS. 1 and 2 show a semiconductor apparatus for driving a load according to a first embodiment.

The apparatus as a load driving semiconductor apparatus controls electric power supply to a load 1. The load 1 is, for example, a lamp, a motor or a resistor.

Specifically, the apparatus is operated based on a voltage, which is divided from an input voltage Vin with a voltage dividing resistors 2, 3. For example, when a base voltage of a driving transistor 4 is input, the apparatus is operated with the input base voltage. The driving transistor 4 is a NPN transistor. A collector of the driving transistor 4 is electrically connected to a power source Vin via voltage dividing resistors 5, 6. When the driving transistor 4 turns on, the divided voltage is input in the device 7 as a gate voltage. The device is a MOSFET, for example. Thus, the device 7 is operated. When the device 7 is driven, a driving power source connected to the source of the device 7 supplies electricity to the load 1, which is connected to the drain of the device 7.

In the load driving semiconductor apparatus, when the voltage divided with the voltage dividing resistors 2, 3 from the input voltage Vin is input into the transistor 4, and the input voltage is disposed in an active range of the transistor 4, it is difficult to supply the gate voltage (i.e., the gate-source voltage) sufficiently. Here, the gate-source voltage is a voltage between the gate and the source of the power semiconductor device 7. Thus, the drain-source voltage becomes large when the drain-source voltage is near a threshold voltage of the device 7, so that excess heat caused by power loss is generated. The region near the threshold voltage is defined as a half on-state region. In the half on-state region, the power semiconductor device 7 half-turns on. Specifically, just before the device 7 completely turns on, the device 7 shows a half on-state.

When the half on-state of the device 7 continues, the device 7 generates excess heat, so that the device may be damaged. Thus, it is necessary to avoid the half on-state of the device 7. Accordingly, in the present embodiment, the load driving semiconductor apparatus has a structure shown in FIG. 2.

The load driving semiconductor apparatus includes a mounting board, on which a heat radiation pattern 11 is formed in a wide area. The heat radiation pattern 11 is made of copper. The heat radiation pattern 11 radiates heat generated in the device 7. For example, the heat radiation pattern 11 provides a wiring connecting to a certain terminal of the power semiconductor device 7. The heat radiation pattern 11 may have a different shape and a different structure as long as the heat radiation pattern 11 transmits the heat from the device 7 to the transistor 4. It is preferable to provide the heat radiation pattern 11 with a wiring connecting to the source terminal 7a or the drain terminal 7b so that the heat radiation pattern 11 effectively transmits the heat in the device 7. The temperature of the source terminal 7a or the drain terminal 7b increases since a maximum current flows through the source terminal 7a or the drain terminal 7b in the device 7. In the present embodiment, the wiring conriecting to the drain terminal 7b provides the heat radiation pattern 11.

The device 7 is mounted on the heat radiation pattern 11. The device 7 is a surface mounting device. The drain terminal 7b is bonded to the heat radiation pattern 11 via a solder or the like. The mounting board 10 includes wiring patterns 12, 13, which are separated from the heat radiation pattern 11. The wiring patterns 12, 13 are connected to the source terminal 7a and the gate terminal 7c, respectively.

The heat radiation pattern 11 has a substantially square shape. Further, the pattern 11 includes a notch, which is partially arranged on one side of the square shape. In FIG. 2, the notch is disposed on an upper side of the device 7. A part 11a of the pattern 11 protrudes from the notch. The transistor 4 is arranged on the protruded part 11a. The protruded part 11a functions as a heat receiving pattern 11a for transmitting the heat from the device 7 to the transistor 4. The heat receiving pattern 11a is disposed under the transistor 4. However, the heat receiving pattern 11a is not electrically connected to the base terminal 4a, the collector terminal 4b and the emitter terminal 4c of the driving transistor 4. Thus, the heat receiving pattern 11a is electrically isolated from the transistor 4.

The transistor 4 is electrically connected to wiring patterns 14-16, which are disposed in the notch. The wiring patterns 14-16 are electrically separated from each other, and further electrically separated from the heat receiving pattern 11a. The transistor 4 is bonded to each wiring pattern 14-16 with solder so that the transistor 4 is physically fixed to the wiring patterns 14-16. Thus, it is not necessary for the transistor 4 to fix to the heat receiving pattern 11a. The transistor 4 merely contacts the heat receiving pattern 11a or the transistor 4 is bonded to the heat receiving pattern 11a with conductive adhesion, so that the heat transmitted to the heat receiving pattern 11a is effectively transmitted to the transistor 4.

A distance between the power semiconductor device 7 and the driving transistor 4 is set such that temperature difference between the device 7 and the transistor 4 is in a predetermined range such as 10° C. Here, the temperature difference is caused by heat transmission via the heat radiation pattern 11. A path shown as an arrow R in FIG. 2 shows a minimum distance of a heat transmitting path from the device 7 to the transistor 7 via the heat radiation pattern 11. The minimum distance is set to be equal to or smaller than 13.26 mm.

Figure 3:
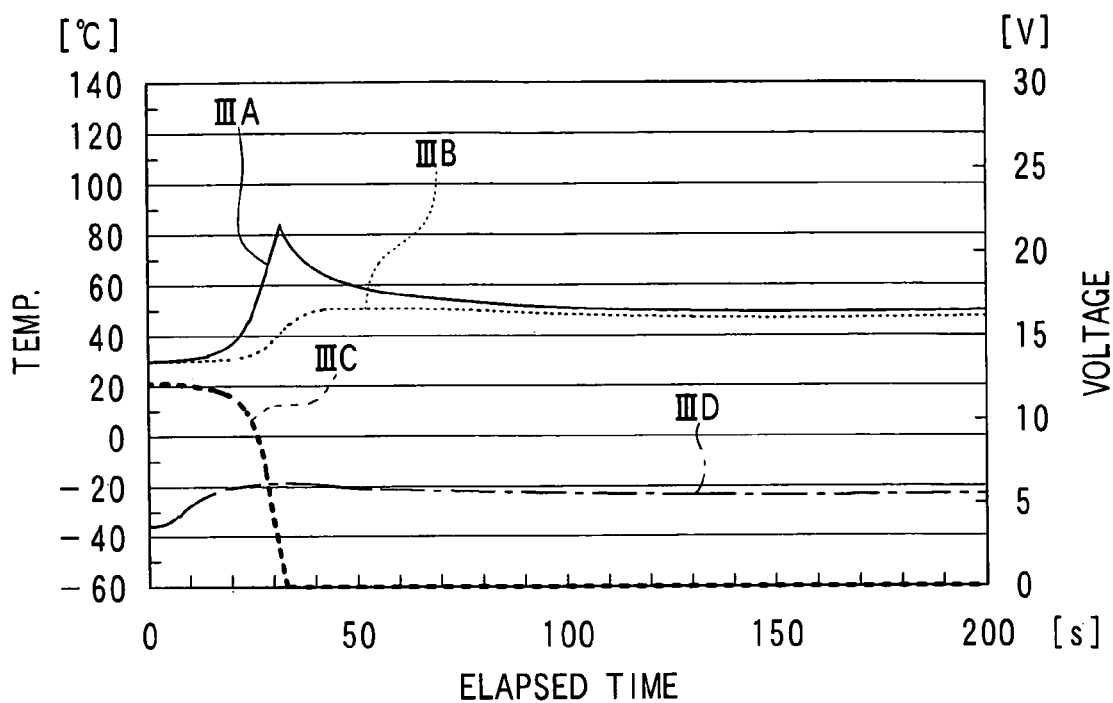
FIG. 3 is a graph showing a relationship among temperature and voltage in each part of the apparatus and elapsed time.
Figure 4:
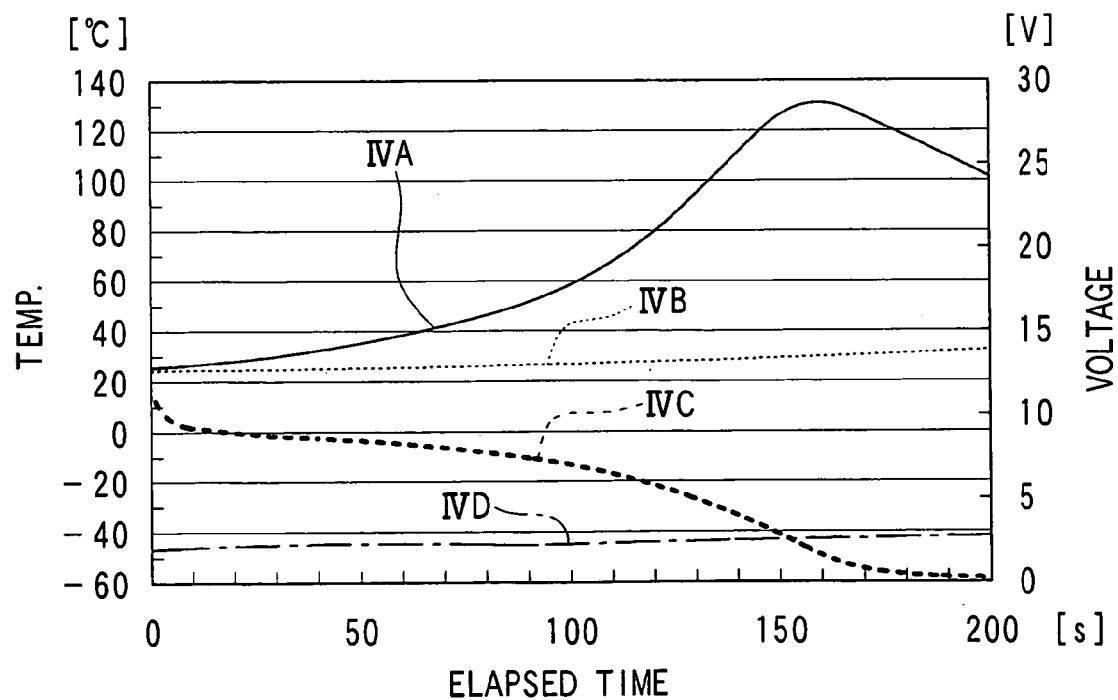
FIG. 4 is a graph showing a relationship among temperature and voltage in each part of a comparison apparatus and elapsed time.

The operation of the load driving semiconductor apparatus will be explained with reference to FIGS. 3 and 4. FIGS. 3 and 4 show a relationship among temperature and voltage in each part of the load driving semiconductor apparatus and a comparison load driving semiconductor apparatus and elapsed time, respectively. FIG. 3 shows the relationship in the load driving semiconductor apparatus according to the present embodiment, and FIG. 4 shows the relationship in the comparison load driving semiconductor apparatus. IIIA represents temperature of the power semiconductor device 7, and IIIB represents temperature of the driving transistor 4. IIIC represents the drain-source voltage, and IIID represents the gate-source voltage in the power semiconductor device 7. IVA represents temperature of a power semiconductor device in the comparison load driving semiconductor apparatus, and IVB represents temperature of a driving transistor in the comparison load driving semiconductor apparatus. IVC represents a drain-source voltage, and IVD represents a gate-source voltage in the power semiconductor device in the comparison load driving semiconductor apparatus.

As shown in FIG. 1, in the load driving semiconductor apparatus according to the present embodiment, when the input voltage Vin is input in order to drive the load 1, the base current flows based on the divided voltage of the resistors 2, 3. Thus, the driving transistor 4 is operated. The power source voltage is divided by the voltage dividing resistors 5, 6. The divided power source voltage is input in the device 7 as a gate voltage, so that the device 7 is operated. Accordingly, the current flows between the drain and the source based on the divided power source voltage so that the load 1 is driven.

In this case, when the input voltage Vin is in a range in which the power semiconductor device 7 is operated in the half on-state, the transistor 4 is operated in the active operation range. Thus, the drain-source voltage becomes large when the drain-source voltage is near a threshold voltage of the device 7, so that the device 7 starts to generate heat caused by power loss.

However, as shown in FIG. 2, the heat generated in the device 7 is transmitted to the transistor 4 via the heat radiation pattern 11 with the heat receiving pattern 11a. As shown in FIG. 3, the temperature of the transistor 4 increases when the temperature of the device 7 increases. Accordingly, the temperature characteristics of the transistor 4 provide to reduce the base-emitter voltage $V_{BE}$, so that the base current increases. The direct current amplification factor $h_{fe}$ of the transistor 4 increases. Thus, the driving performance of the transistor 4 is improved according to temperature increase, and therefore, the collector current increases. Further, the threshold voltage of the power semiconductor device 7 is reduced in accordance with heat generated in the device 7.

Thus, because of the temperature characteristics of the transistor 4 and the device 7, the gate-source voltage $V_{GS}$ of the device 7 increases, as shown in FIG. 3. Specifically, the gate-source voltage $V_{GS}$ is obtained from the following equation.

$$V_{GS}=R_{GS}\times[\{(Vin-V_{BE})/Rin\}-V_{BE}/R_L]\times h_{fe} \quad (F1)$$

Thus, as the base-emitter voltage $V_{BE}$ becomes small, and as the direct current amplification factor $h_{fe}$ becomes large, the gate-source voltage $V_{GS}$ is increased. Thus, the device 7 is not operated in the half on-state. The excess heat generated in the device 7 is reduced.

In the equation F1, $R_{GS}$ represents a resistance of the voltage dividing resistor 5, $V_{GS}$ represents the gate-source voltage of the device 7, $V_{BE}$ represents the base-emitter voltage of the transistor 4, Rin represents the resistance of the voltage dividing resistor 2, and $R_L$ represents the resistance of the voltage dividing resistor 3.

Figure 5:
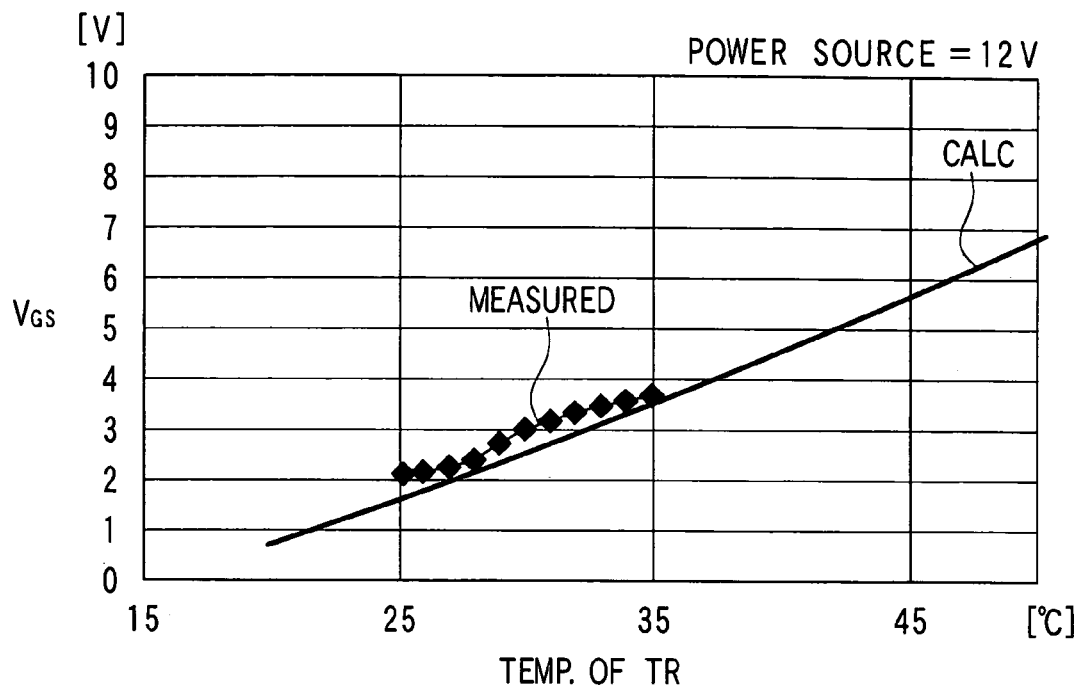
FIG. 5 is a graph showing a relationship between temperature of a driving transistor and a gate-source voltage of a power semiconductor device.

In the transistor 4, the direct current amplification factor $h_{fe}$ increases even when the temperature of the transistor 4 increases by 10° C., and further, the driving performance of the transistor 4 is improved because the base-emitter voltage $V_{BE}$ is reduced. The relationship between the temperature of the transistor 4 and the gate-source voltage $V_{GS}$ of the device 7 is shown in FIG. 5. As shown in FIG. 5, the gate-source voltage $V_{GS}$ increases by a ratio of 0.21V/0° C. according to temperature increase. When the temperature of the transistor 4 increases by 10° C., the gate-source voltage $V_{GS}$ increases by 2 volts. Thus, the device 7 has sufficient gate-source voltage $V_{GS}$ so that the device 7 is not operated in the half on-state.

In a comparison load driving semiconductor apparatus, an input voltage Vin is input in order to drive a load. When a driving transistor 4 is driven, a power semiconductor device 7 is operated. When a load 1 is driven, heat generated in the power semiconductor device 7 is not substantially transmitted to the driving transistor 4. As shown in FIG. 4, although the temperature of the device 7 increases, the temperature of the transistor 4 does not increase substantially. Accordingly, the gate-source voltage $V_{GS}$ of the device 7 does not increase, so that the device 7 is operated in the half on-state. Thus, in the comparison load driving semiconductor apparatus, the device 7 generates excess heat.

In the load driving semiconductor apparatus according to the present embodiment, the transistor 4 is arranged on the heat receiving pattern 11a as a part of the heat radiation pattern 11, which radiates the heat in the power semiconductor device 7. The heat of the device 7 is transmitted to the transistor 4 effectively. Thus, the driving performance of the transistor 4 is improved, and the device 7 is not operated in the half on-state. The operating performance of the power semiconductor device 7 is improved without increasing the performance of the driving circuit, e.g., without adding an additional circuit structure. The load driving semiconductor apparatus restricts excess heat in the device 7.

The minimum distance of the heat transmission path between the power semiconductor device 7 and the driving transistor 4 is equal to or smaller than 13.26 mm. Thus, the temperature difference between the power semiconductor device 7 and the driving transistor 4 is equal to or smaller than 10° C. The reason why the temperature difference is equal to or smaller than 10° C. will be explained as follows.

Figure 6:
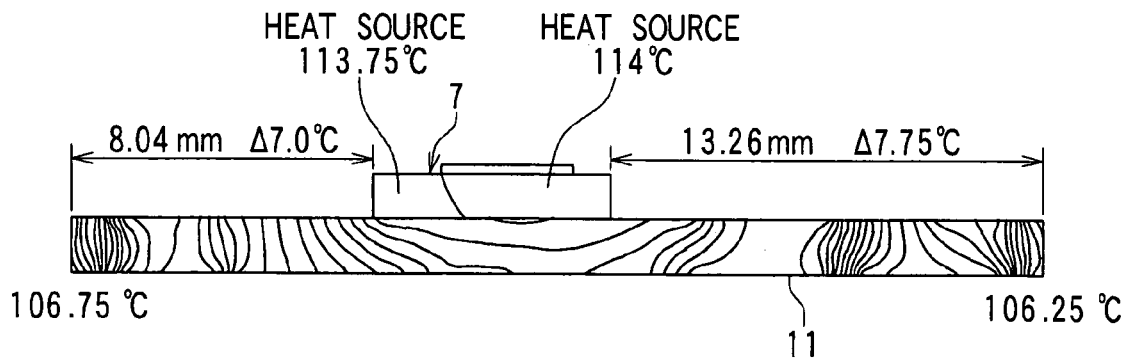
FIG. 6 is a cross sectional view showing temperature distribution in a metal plate.

FIG. 6 shows temperature distribution of a metal plate, which is made of the same material as the heat radiation pattern 11. The power semiconductor device 7 is arranged at a center of the metal plate. The temperature distribution with reference to the distance from the device 7 is studied. In FIG. 6, isothermal lines are shown at 0.25° C. intervals.

The highest temperature in the device 7 is 114° C., and the lowest temperature in the device 7 is 113.75° C. The temperature of a point spaced apart from the device 7 by 8.04 mm is 106.75° C., and the temperature of another point spaced apart from the device 7 by 13.26 mm is 106.25° C. The temperature difference between the temperature of the point apart from the device 7 by 8.04 mm and the temperature of the device 7 is 7.0° C. The temperature difference between the temperature of the point apart from the device 7 by 13.26 mm and the temperature of the device 7 is 7.75° C. In general, as the distance from a heat source increases, the temperature difference between the heat source and a point increases. Accordingly, when the distance from the device 7 is equal to or smaller than 13.26 mm, the temperature difference between the device 7 and the point is equal to or smaller than 10° C.

The temperature of the transistor 4 increases in accordance with the temperature increase of the device 7, so that the driving performance of the transistor 4 is improved. It is preferable to reduce the minimum distance of the heat transmission path between the device 7 and the transistor 4. Specifically, when the transistor 4 is arranged such that the temperature difference between the device 7 and the transistor 4 is equal to or smaller than 10° C., the temperature of the transistor 4 effectively and sufficiently increases in accordance with the temperature increase of the device 7. Thus, the driving performance of the transistor 4 is sufficiently improved.

Specifically, when the minimum distance of the heat transmission path between the device 7 and the transistor 4 is equal to or smaller than 13.26 mm, the driving performance of the transistor 4 is sufficiently improved. Thus, the excess heat in the device 7 is much restricted.

Here, in FIG. 3, the temperature difference between the device 7 and the transistor 4 is equal to or larger than 10° C. when the elapsed time is around 30 seconds. This is because the temperature increase of the transistor 4 is slow, i.e., the temperature increase of the transistor 4 and the temperature increase of the device 7 have a time lag. However, as shown in FIG. 3, the temperature difference between the device 7 and the transistor 4 finally becomes equal to or smaller than 10° C. With reference to the magnitude of the time lag and the temperature difference, it is preferable to reduce the minimum distance of the heat transmission path between the device 7 and the transistor 4. As the minimum distance becomes shorter, the driving performance of the transistor 4 is much improved. Thus, it is preferable to set the minimum distance of the heat transmission path equal to or smaller than 13.26 mm.

Second Embodiment

Figure 7:
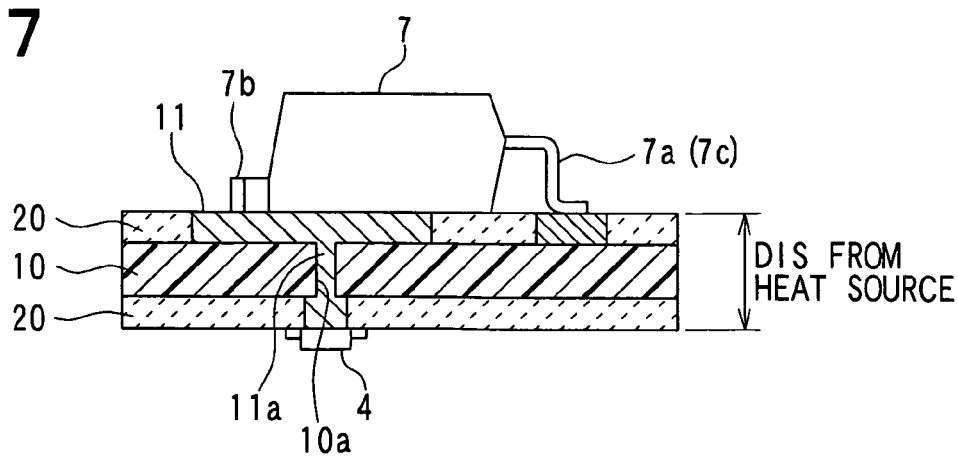
FIG. 7 is a cross sectional view showing a semiconductor apparatus for driving a load according to a second embodiment.

FIG. 7 shows a load driving semiconductor apparatus according to a second embodiment. In the load driving semiconductor apparatus in FIG. 7, arrangement of the transistor 4 and the device 7 is different from that in FIG. 2.

Specifically, in FIG. 2, the transistor 4 and the device 7 are mounted on the same surface of the mounting board 10. In FIG. 7, the device 7 is mounted on one side of the board 10, and the transistor 4 is mounted on the other side of the board 10, which is opposite to the device 7. The board 10 includes a through hole 10a, which penetrates from one side to the other side of the board 10. The heat radiation pattern 11 is formed in the through hole 10a so that the pattern 10 is exposed on the one side of the board 10 and exposed on the other side of the board 10. A part of the heat radiation pattern 11, which is exposed from the backside of the mounting board 10 via the through hole 10a functions as the heat receiving pattern 11a. Another part of the heat radiation pattern 11, which is exposed from a solder resist 20 and disposed on both of the front and back sides of the board 10, is bonded to the power semiconductor device 7 and contacts the transistor 4. Thus, the device 7 is opposite to the transistor 4 via the board 10.

In the load driving semiconductor apparatus, the minimum distance of the heat transmission path between the power semiconductor device 7 and the transistor 4 is a thickness of the board 10. Accordingly, the heat transmission path becomes short. The driving performance of the transistor 4 is much improved, and the excess heat in the device 7 is restricted.

In this case, since the board 10 is sandwiched between the device 7 and the transistor 4, and the device 7 is opposite to the transistor 4, the heat transmission path from the device 7 to the transistor 4 becomes short. When the minimum distance of the heat transmission path is equal to or smaller than 13.26 mm, the above effect is obtained.

Other Embodiments

In the above embodiments, the power semiconductor device 7 is a MOSFET, and the driving transistor 4 is a NPN type transistor. Alternatively, the device 7 may be an IGBT, and the transistor may be a PNP type transistor.

In the above embodiments, FIGS. 2 and 7 clearly show that a portion of the, heat radiation pattern 11 that is connected to the drain terminal 7b is exposed. However, FIGS. 2 and 7 do not clearly show that other portions of the heat radiation pattern 11 is exposed. The other portions may be exposed or not exposed. Since the temperature of the bottom of the transistor 4 is determined based on the minimum distance of the heat transmission path from the device 7, the effects according to the above embodiments is obtained in both cases that the other portions of the heat radiation pattern 11 is exposed or not exposed.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A load driving semiconductor apparatus comprising:
a driving transistor, which operates based on an input voltage from an external circuit;
a power semiconductor device controlling power supply to a load in such a manner that the power semiconductor device supplies electric power to the load when the transistor operates, and the power semiconductor device stops supplying electric power to the load when the transistor stops operating; and
a mounting board, on which the driving transistor and the power semiconductor device are mounted,
wherein the mounting board includes a heat radiation pattern for emitting heat generated in the power semiconductor device, and
wherein the heat radiation pattern includes a heat receiving pattern, on which the driving transistor is mounted.

2. The apparatus according to claim 1,
wherein temperature difference between the power semiconductor device and the driving transistor is equal to or smaller than 10° C.

3. The apparatus according to claim 1,
wherein a minimum distance of the heat radiation pattern between the power semiconductor device and the driving transistor is equal to or smaller than 13.26 mm.

4. The apparatus according to claim 3,
wherein a minimum distance of the heat radiation pattern between the power semiconductor device and the driving transistor is equal to or smaller than 8.04 mm.

5. The apparatus according to claim 1,
wherein the driving transistor, the power semiconductor device and the heat radiation pattern are arranged on one side of the mounting board.

6. The apparatus according to claim 5,
wherein the heat radiation pattern has a square shape with a notch,
wherein the notch is disposed on one side of the square shape,
wherein the driving transistor is arranged in the notch,
wherein the heat receiving pattern protrudes from a sidewall of the notch toward the driving transistor, and
wherein the power semiconductor device is arranged on the other side of the square shape, which is opposite to the one side.

7. The apparatus according to claim 6,
wherein the heat receiving pattern has a width along with a direction perpendicular to a heat transmission path from the power semiconductor device to the driving transistor,
wherein the heat radiation pattern other than the heat receiving pattern has a width along with a direction perpendicular to the heat transmission path from the power semiconductor device to the driving transistor, and
wherein the width of the heat receiving pattern is smaller than the width of the heat radiation pattern.

8. The apparatus according to claim 1,
wherein the power semiconductor device and the heat radiation pattern other than the heat receiving pattern are arranged on one side of the mounting board,
wherein the driving transistor is arranged on the other side of the mounting board,
wherein the mounting board further includes a through hole, which penetrates from the one side to the other side of the board, and wherein the heat receiving pattern is disposed on the through hole, and exposed from the other side so that the driving transistor contacts the heat receiving pattern.

9. The apparatus according to claim 8, wherein the heat receiving pattern has a width along with a direction perpendicular to a heat transmission path from the power semiconductor device to the driving transistor, wherein the heat radiation pattern other than the heat receiving pattern has a width along with a direction perpendicular to the heat transmission path from the power semiconductor device to the driving transistor, and wherein the width of the heat receiving pattern is smaller than the width of the heat radiation pattern.

* * * * *